(12) United States Patent
Sung et al.

(10) Patent No.: US 8,237,351 B2
(45) Date of Patent: Aug. 7, 2012

(54) ORGANIC LIGHT-EMITTING DISPLAY DEVICE AND METHOD OF MANUFACTURING THE SAME

(75) Inventors: Un-Cheol Sung, Anyang-si (KR); Jung-Soo Rhee, Seoul (KR); Ji-Hye Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 600 days.

(21) Appl. No.: 12/197,021

(22) Filed: Aug. 22, 2008

(65) Prior Publication Data

US 2009/0066236 A1   Mar. 12, 2009

(30) Foreign Application Priority Data

Sep. 11, 2007   (KR) .................. 10-2007-0091923

(51) Int. Cl.
*H01J 1/64* (2006.01)
(52) U.S. Cl. ................... 313/503; 313/505; 313/506
(58) Field of Classification Search ........... 313/503–506
See application file for complete search history.

(56) References Cited

U.S. PATENT DOCUMENTS

| | | | | |
|---|---|---|---|---|
| 6,420,834 | B2 * | 7/2002 | Yamazaki et al. | 315/169.3 |
| 6,958,490 | B2 * | 10/2005 | Okamoto et al. | 257/40 |
| 7,402,948 | B2 * | 7/2008 | Yamazaki et al. | 313/506 |
| 7,646,144 | B2 * | 1/2010 | Cok | 313/503 |
| 7,692,186 | B2 * | 4/2010 | Yamazaki et al. | 257/40 |
| 7,915,816 | B2 * | 3/2011 | Kashiwabara et al. | 313/506 |
| 2003/0227021 | A1 * | 12/2003 | Yamazaki et al. | 257/83 |
| 2004/0178722 | A1 * | 9/2004 | Cok et al. | 313/506 |
| 2005/0012105 | A1 * | 1/2005 | Yamazaki et al. | 257/79 |
| 2005/0073243 | A1 * | 4/2005 | Yamazaki et al. | 313/498 |
| 2007/0247064 | A1 * | 10/2007 | Hosokawa | 313/504 |
| 2010/0230664 | A1 * | 9/2010 | Yamazaki et al. | 257/40 |

\* cited by examiner

*Primary Examiner* — Peter Macchiarolo
(74) *Attorney, Agent, or Firm* — Innovation Counsel LLP

(57) ABSTRACT

An organic light-emitting display device includes a thin film transistor on a substrate, a protective layer and a planarization layer covering the thin film transistor, a pixel electrode connected to the thin film transistor, and a wall positioned on at least a portion of the pixel electrode. The planarization layer includes an aperture which exposes a portion of the pixel electrode. An organic layer is formed on the pixel electrode, and a common electrode is formed on the organic layer. An auxiliary electrode layer is formed to overlap the wall on the common electrode.

11 Claims, 9 Drawing Sheets

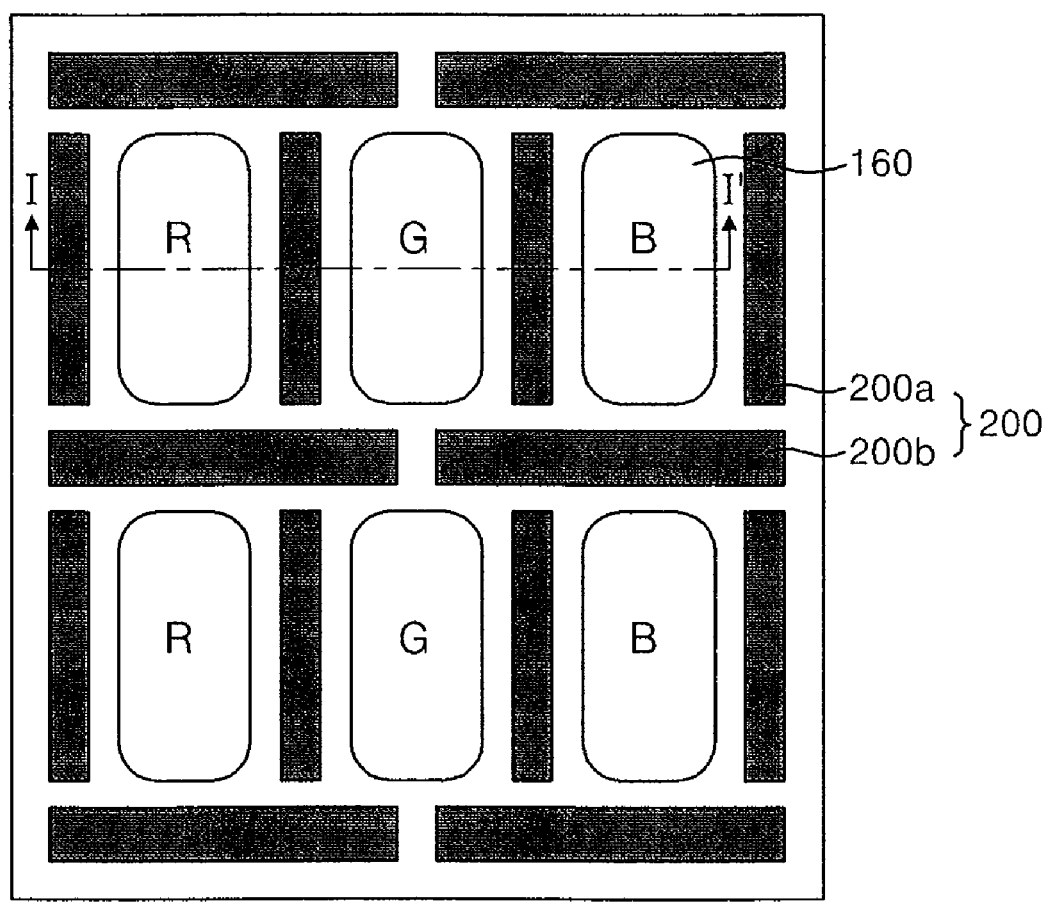

ORGANIC LIGHT-EMITTING DISPLAY DEVICE AND METHOD OF MANUFACTURING THE SAME

This application claims priority under 35 U.S.C. §119 to Korean Patent Application No. 10-2007-0091923, filed on Sep. 11, 2007 in the Korean Intellectual Property Office (KIPO), the contents of which is incorporated herein by reference in its entirety.

BACKGROUND OF THE INVENTION

1. Field of the Invention

The present disclosure relates to an organic light-emitting display device and a method of manufacturing the same, and more particularly, to an organic light-emitting display device whose manufacturing costs can be reduced by simplifying the manufacturing process, and a method of manufacturing the same.

2. Description of the Related Art

Generally, an organic light-emitting display ("OLED") device displays images by electrically exciting an organic material. The OLED device includes a hole injection electrode (or anode), an electron injection electrode (or cathode), and an organic light-emitting layer formed therebetween. When a voltage is applied to the anode and the cathode, holes and electrons are injected into the organic light-emitting layer and recombined in the organic light-emitting layer, thereby generating excitons. The OLED device emits light by energy generated when the excitons transition to a ground state from an excited state. The organic light-emitting layer further includes an electron transport layer, a hole transport layer, an electron injection layer, and a hole injection layer to improve the brightness efficiency of the organic light-emitting layer.

The OLED devices are classified into either a top emission type or a bottom emission type depending on the direction in which light generated from the organic light-emitting layer is emitted.

Since a high-resolution OLED device is in demanded, the top emission type OLED device having a high aperture ratio is increasingly being developed. In the top emission type OLED device, light is emitted not through a lower transparent electrode and a substrate, but rather through an upper transparent or semitransparent common electrode.

The common electrode may be a transflective film formed by thinly depositing a metal or an alloy thereof, or may be formed of a transparent conductive material such as indium tin oxide ("ITO") or indium zinc oxide ("IZO").

When the common electrode is formed of the transflective film, a desirable transmittance may be obtained. However, it is difficult to use the thinly formed film as an electrode due to a large resistance. Furthermore, when the common electrode is formed of the transparent conductive oxide material, an electric resistance is remarkably increased relative to the metal.

The OLED device may exhibit a voltage drop caused by a resistance component as its size is increased, thereby brightly displays images at edge portions and darkly displaying images at center portions. To resolve this problem, an auxiliary electrode line is further provided to a lower thin film transistor array to supply a power voltage to the OLED device. However, since the auxiliary electrode line is formed before forming the organic light-emitting layer, masking and patterning processes must be performed several times so as not to cover the auxiliary electrode line with an organic material whenever each layer of the organic light-emitting layer is formed.

BRIEF SUMMARY OF THE INVENTION

One embodiment of the present invention provides an organic light-emitting display ("OLED") device that is capable of simplifying a manufacturing process and reducing a resistance of a common electrode, and a method of manufacturing the same.

In one exemplary embodiment, an organic light-emitting display device includes a substrate, a thin film transistor formed on the substrate, a planarization layer on the thin film transistor, a pixel electrode connected to the thin film transistor, a wall on the pixel electrode and the planarization layer, the wall including an aperture exposing a portion of the pixel electrode, an organic layer on the pixel electrode, a common electrode on the organic layer, and an auxiliary electrode layer formed on the common electrode to overlap the wall.

The organic layer includes a hole injection layer formed on the pixel electrode, a hole transport layer formed on the hole injection layer, an organic light-emitting layer formed on the hole transport layer to overlap the pixel electrode, an electron transport layer formed on the organic light-emitting layer, and an electron injection layer formed on the hole transport layer.

The auxiliary electrode layer includes at least a first metallic layer.

The first metallic layer may include at least one selected from the group consisting of aluminum (Al), silver (Ag), cupper (Cu), gold (Au), iron (Fe), indium (In), neodymium (Nd), nickel (Ni), and palladium (Pd) or an alloy thereof.

The auxiliary electrode layer may further include a metallic oxide layer formed on the first metallic layer.

The metallic oxide layer may include at least one selected from the group consisting of silicon oxide (SiO, $SiO_2$), barium oxide (BaO), aluminum oxide ($Al_2O_3$), germanium oxide ($GeO_2$), magnesium oxide (MgO), neodymium oxide ($Nd_2O_3$), tin oxide ($SnO_2$), titanium oxide ($TiO_2$), and tungsten oxide ($WO_3$).

The auxiliary electrode layer may further include a second metallic layer formed on the metallic oxide layer.

The second metallic layer may include at least one selected from the group consisting of aluminum (Al), silver (Ag), cupper (Cu), gold (Au), iron (Fe), indium (In), neodymium (Nd), nickel (Ni), and palladium (Pd) or an alloy thereof.

The pixel electrode may be formed of a reflective conductive material.

The reflective conductive material may include at least one selected from the group consisting of aluminum (Al), magnesium (Mg), silver (Ag), mercury (Hg), and calcium (Ca).

The common electrode may be formed of a transparent conductive material.

The transparent conductive material may include at least one selected from the group consisting of indium tin oxide (ITO), tin oxide (TO), indium zinc oxide (IZO), and indium tin zinc oxide (ITZO).

The organic light-emitting display device may further include a color filter formed on the common electrode to overlap the pixel electrode.

The organic light-emitting display device may further include a protective layer interposed between the planarization layer and the TFT.

In another exemplary embodiment, a method for manufacturing an organic light-emitting display device includes forming a thin film transistor on a substrate, forming a planarization layer with a contact hole on the TFT, forming a pixel electrode on the planarization layer, forming a wall on the planarization layer, the wall exposing a portion of the pixel electrode, forming an organic layer on the pixel electrode, forming a common electrode on the organic layer, and forming an auxiliary electrode layer on the common electrode to overlap the wall.

The forming of the organic layer may include forming a hole injection layer on the pixel electrode, forming a hole transport layer on the hole injection layer, forming an organic light-emitting layer on the hole transport layer to overlap the pixel electrode, forming an electron transport layer on the organic light-emitting layer, and an electron injection layer on the electron transport layer.

The method for manufacturing an organic light-emitting display device may further include forming a color filter on the common electrode to overlap the pixel electrode.

The forming of the color filter may use a thermal evaporation method.

The forming of the auxiliary electrode layer may include forming a first metallic layer on the common electrode by depositing a metal to overlap the wall.

The forming of the auxiliary electrode layer may include forming a first metallic layer on the common electrode by depositing a metal to overlap the wall, and forming a metallic oxide layer on the first metallic layer by depositing a metallic oxide material.

The forming of the auxiliary electrode layer may include forming the first metallic layer on the common electrode by depositing a metal to overlap the wall, forming a metallic oxide layer on the first metallic layer by depositing a metallic oxide, and forming a second metallic layer on the metallic oxide layer by depositing a metal.

The method for manufacturing an organic light-emitting display device may further include forming a protective layer between and the planarization layer and the TFT.

BRIEF DESCRIPTION OF THE DRAWINGS

The above and/or other aspects, features and advantages will become more apparent from the following detailed description when taken in conjunction with the accompanying drawings, in which:

FIG. 1 is a plan view of an OLED device according to an exemplary embodiment of the present invention;

DETAILED DESCRIPTION OF THE INVENTION

Hereinafter, various embodiments are described in detail with reference to the accompanying drawings.

Figure 2A:
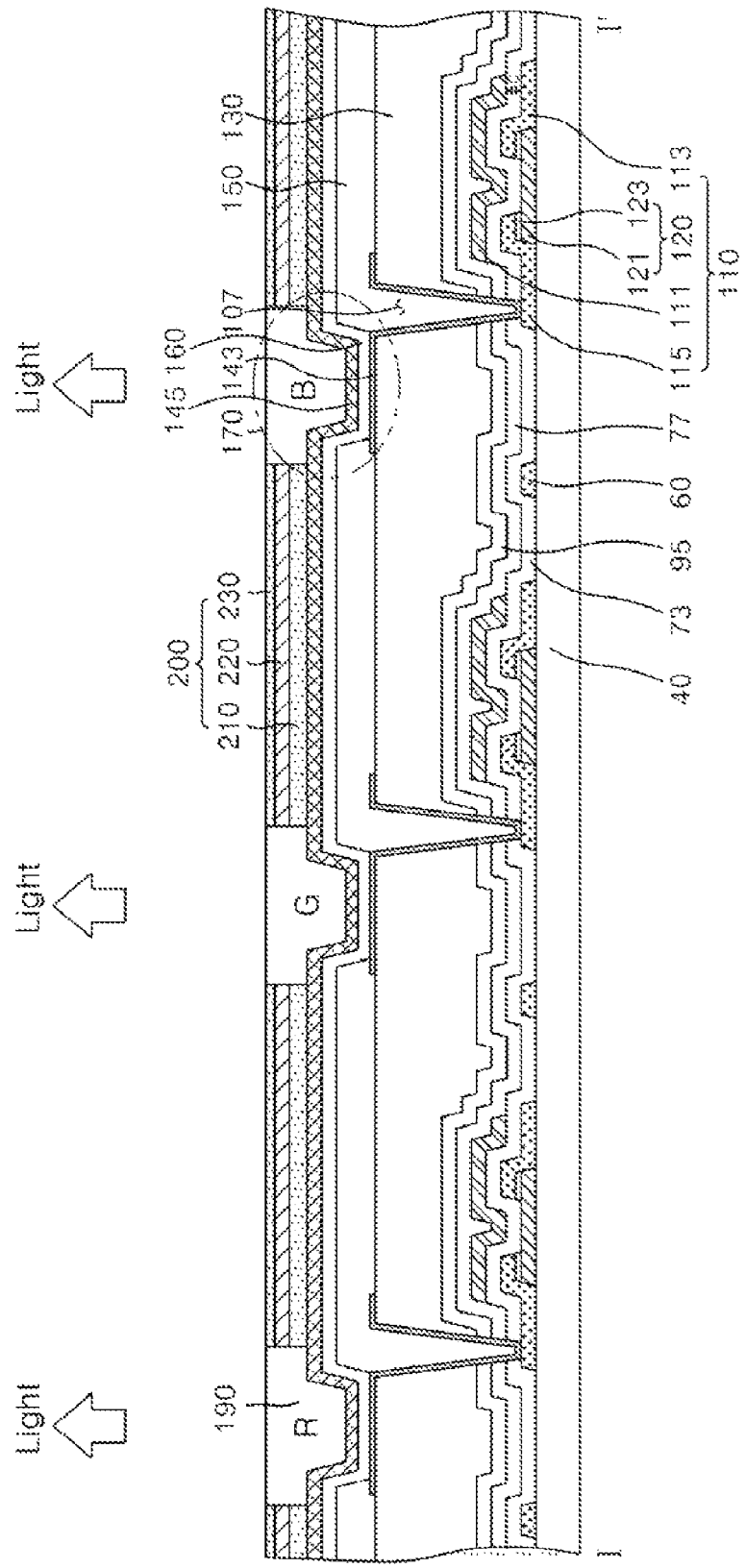
FIG. 2A is a cross-sectional view taken along line I-I' of FIG. 1.

FIG. 1 is a plan view of an OLED device according to an exemplary embodiment and FIG. 2A is a cross-sectional view taken along line I-I' of FIG. 1.

The OLED device includes a gate line (not shown), a data line 60, a power line (not shown), a switching thin film transistor ("TFT") (not shown), a driving TFT 110, a pixel electrode 143, an organic layer 160, a common electrode 145, and an auxiliary electrode layer 200. The OLED device may also include a color filter 190 on the organic layer 160. The auxiliary electrode layer 200 includes a first auxiliary electrode layer 200a and a second auxiliary electrode layer 200b. The first auxiliary electrode layer 200a is arranged in one direction and the second auxiliary electrode layer 200b is arranged in the other direction perpendicular to the one direction.

A substrate 40 may be formed of a transparent insulating material. The gate line on the substrate 40 supplies a gate signal to the switching TFT and the data line 60 on the substrate 40 supplies a data signal to the switching TFT. The power line on the substrate 40 supplies a power signal to the driving TFT 110.

In response to the gate signal supplied from the gate line, the switching TFT is turned on to apply the data signal supplied from the data line 60 to a storage capacitor C and a gate electrode 111 of the driving TFT 110.

In response to the data signal supplied to the gate electrode 111, the driving TFT 110 controls an electric current to be applied from a power line to an organic light-emitting element 170 to control the amount of light emitted from the organic light-emitting element 170. The driving TFT 110 includes a source electrode 113, a drain electrode 115 facing the source electrode 113 and connected to the pixel electrode 143 of the organic light-emitting element 170, and a semiconductor pattern 120 forming a channel portion between the source and drain electrodes 113 and 115.

The semiconductor pattern 120 includes an active layer 121 and an ohmic contact layer 123. The active layer 121 overlaps the gate electrode 111 with a first gate insulating layer 73 disposed therebetween. The ohmic contact layer 123 is formed on the active layer 121 except for the channel portion to ohmic-contact the source and drain electrodes 113 and 115. The active layer 121 may be made of polysilicon in consideration of a characteristic of the driving TFT 110 which allows current to flows continuously during a light emitting period of the organic light-emitting element 170.

The storage capacitor C is formed such that the power line overlaps the gate electrode 111 of the driving TFT 110 with the first gate insulating layer 73 disposed therebetween. When the switching TFT is turned off, the storage capacitor C supplies a constant electric current to the driving TFT 110 by its charge voltage until a data signal of a next frame is supplied, so that the organic light-emitting element 170 continuously emits light.

The pixel electrode 143 is independently formed in each sub-pixel area on a planarization layer 130. The pixel electrode 143 is electrically connected to an exposed portion of the drain electrode 115 of the driving TFT 110 through a contact hole 107 penetrating a protective layer 95, the first gate insulating layer, a second gate insulating layer, and the planarization layer 130. The pixel electrode 143 may be formed of a reflective electrode including a reflective material such as aluminum ("Al"), magnesium ("Mg"), silver ("Ag"), mercury ("Hg"), calcium ("Ca"), etc. The pixel electrode 143 15 may be further formed of a transparent electrode such as indium tin oxide ("ITO") or indium zinc oxide ("IZO") on the reflective electrode.

Figure 2B:
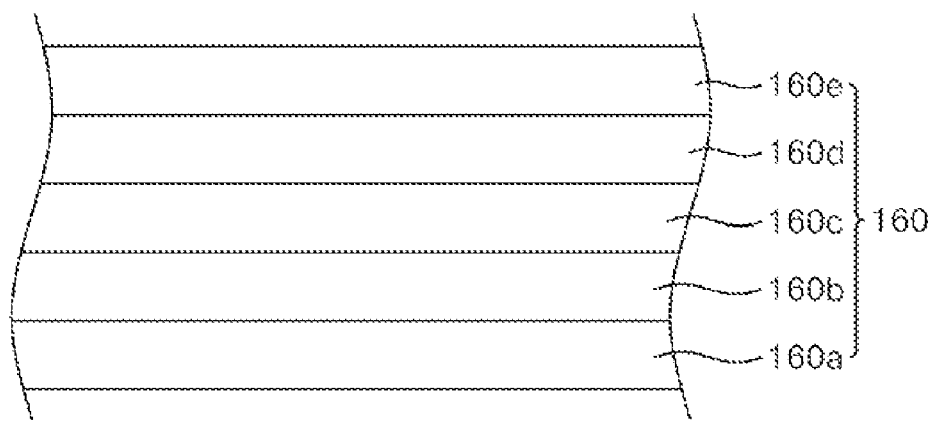
FIG. 2B is an expanded view of layer 160 of FIG. 2A.

A wall 150 is formed on the pixel electrode 143. The wall 150 is made of a photoresist material to function as an insulating layer. The wall 150 blocks light generated from the organic layer 160 formed on the wall 150 from being emitted in a 20 downward direction as viewed in FIG. 2.

The organic light-emitting element 170 includes the pixel electrode 143, the organic layer 160, and the common electrode 145. The pixel electrode 143 is formed on the planarization layer 130. The common electrode 145 is formed on the organic layer 160. The organic layer 160 (FIG. 2B) is constructed by well known techniques and includes a hole injection layer 160a, a hole transport layer 160b, an organic light-emitting layer 160c, an electron transport layer 160d, and an electron injection layer 160e that are sequentially stacked over the pixel electrode 143. The organic light-emitting layer is formed in each sub-pixel of red ("R"), green ("G"), and blue ("B") colors. The hole injection layer, the hole transport layer, the electron transport layer, and the electron injection layer control the movement of holes and electrons, thereby causing the organic light-emitting layer to emit light efficiently.

The common electrode 145 is formed on the organic layer 160 and forms an electric field together with the pixel electrode 143. The common electrode 145 may be thinly formed of a metal or an alloy thereof. Alternatively, the common electrode 145 may be formed of a transparent electrode such as ITO, tin oxide ("TO", or $SnO_2$), IZO, or indium tin zinc oxide ("ITZO").

The organic light-emitting layer formed in the organic layer 160 emits light in an amount which is a function of the voltage applied to the common electrode 145. The light is reflected from the pixel electrode 143 and emitted to the top side of the OLED device through the common electrode 145.

The auxiliary electrode layer 200 is formed to overlap the wall 150 on the common electrode 145. The auxiliary electrode layer 200 includes a first metallic layer 210, a metallic oxide layer 220, and a second metallic layer 230 that are sequentially stacked. The auxiliary electrode layer 200 is formed such that the first metallic layer 210 having a low specific resistance contacts the common electrode 145, thereby preventing a voltage drop caused by a resistance element of the common electrode 145. The stacked structure of the first metallic layer 210 and the metallic oxide layer 220 or of the first metallic layer 210, the metallic oxide layer 220, and the second metallic layer 230 absorbs light by using the difference in a refractive index between the respective layers, thereby serving as a black matrix. The first metallic layer 210 and the second metallic layer 230 may be formed of at least one selected from the group consisting of Al, Ag, cupper ("Cu"), gold ("Au"), iron ("Fe"), indium ("In"), neodymium ("Nd"), nickel ("Ni"), and palladium ("Pd") that have a low specific resistance, or may be formed of an alloy thereof. The metallic oxide layer 220 may be formed of at least one selected from the group consisting of a silicon oxide (SiO, $SiO_2$), barium oxide (BaO), aluminum oxide ($Al_2O_3$), germanium oxide ($GeO_2$), magnesium oxide (MgO), neodymium oxide ($Nd_2O_3$), tin oxide ($SnO_2$), titanium oxide ($TiO_2$), and tungsten oxide ($WO_3$).

The auxiliary electrode layer 200 as described above includes the first metallic layer 210, the metallic oxide layer 220, and the second metallic layer 230, however, this disclosure may be embodied in many different forms and should not be construed as limited to the embodiments set forth herein. For example, the auxiliary electrode layer 200 may be formed of a stacked structure where only the first metallic layer 210 is formed, or the first metallic layer 210 along with the metallic oxide layer 220 are formed.

The color filter 190 overlaps the pixel electrode 143 on the common electrode 145. The color filter 190 allows light generated from the organic layer 160 to pass through, thereby improving a contrast ratio with respect to external light. Accordingly, the OLED device can achieve a high contrast ratio without using a polarizer film. The R, G, or B light passing through the color filter 190 is emitted to the top side of the OLED device.

FIG. 3A to FIG. 3J are cross-sectional views illustrating a method of manufacturing the OLED device according to an exemplary embodiment of the present invention, focusing on a sub-pixel area.

Figure 3A:
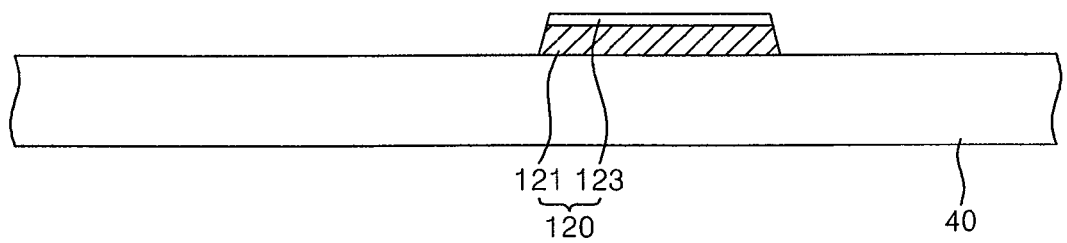
FIG. 3A to FIG. 3J are cross-sectional views illustrating a method of manufacturing the OLED device according to the exemplary embodiment of the present invention.

Referring to FIG. 3A, an active layer 121 and an ohmic contact layer 123 of a driving TFT are formed on a substrate 40. The active layer 121 and ohmic contact layer 123 are made of polysilicon in consideration of a driving characteristic of the driving TFT. More specifically, an amorphous silicon layer and an n+-doped amorphous silicon layer are deposited on the entire surface of the substrate 40 with a predetermined thickness. The amorphous silicon is crystallized by using laser or a solid-phase crystallization technique. The solid phase-crystallization technique is usually used for a large-scaled substrate.

The crystallized silicon layer is then patterned by a photolithographic process and an etching process to form a semiconductor pattern 120 including the active layer 121 and the ohmic contact layer 123 as shown in FIG. 3A.

Figure 3B:
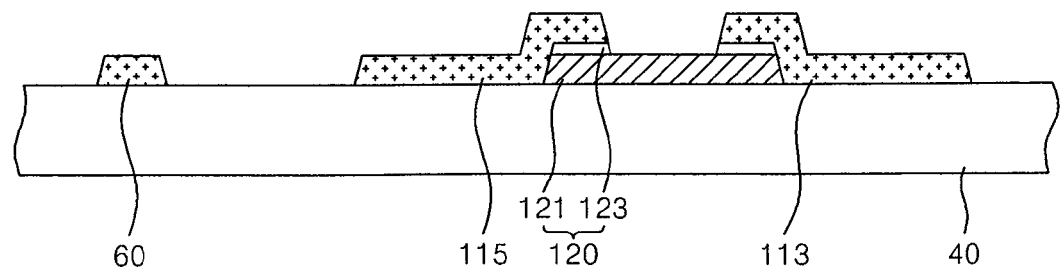

Referring to FIG. 3B, a source electrode 113 and a drain electrode 115 are formed. In more detail, a conductive metal is deposited over the entire surface of the substrate 40 by using a sputtering technique and then patterned by a photolithographic process and an etching process to form the source and drain electrodes 113 and 115. A portion of the ohmic contact layer 123 which is not covered with the source and drain electrodes 113 and 115 is removed by an etching process, thereby forming a channel portion comprised only of amorphous silicon. When the source electrode 113 is formed, a power line and a data line 60 are simultaneously formed.

Figure 3C:
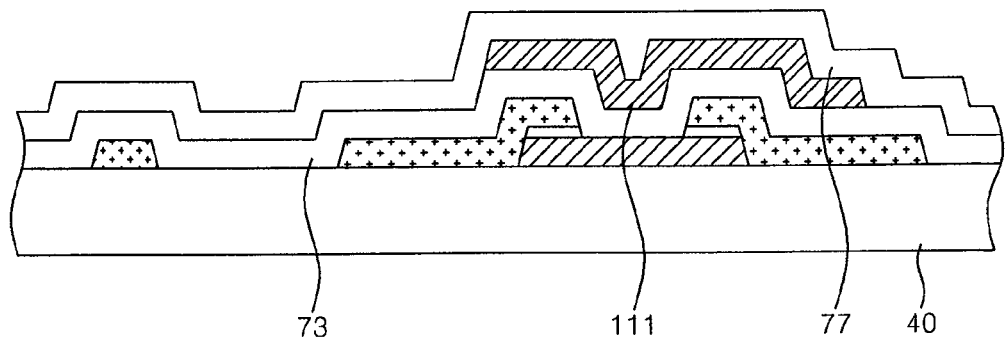

Referring to FIG. 3C, a first gate insulating layer 73 and a gate electrode 111 are formed. The first gate insulating layer 73 is formed over the entire surface of the substrate 40. In one example, an inorganic insulating material such as a silicon oxide ("SiOx"), or a silicon nitride ("SiNx") is formed over the entire surface of the substrate 40 by a plasma enhanced chemical vapor deposition ("PECVD") technique to form the first gate insulating layer 73. And then the gate electrode 111 is formed on the first gate insulating layer 73. A conductive metal is deposited over the entire surface of the substrate 40 by using a sputtering technique and then a photolithographic process and an etching process is performed to define the gate electrode 111. A gate line is simultaneously formed when the gate electrode 111 is formed. A second gate insulating layer 77 is then deposited on the entire surface of the substrate 40 on which the gate electrode 111 is formed. The second gate insulating layer 77 is formed in the same way as the first gate insulating layer 73, and thus repeated detailed description is not required.

Figure 3D:
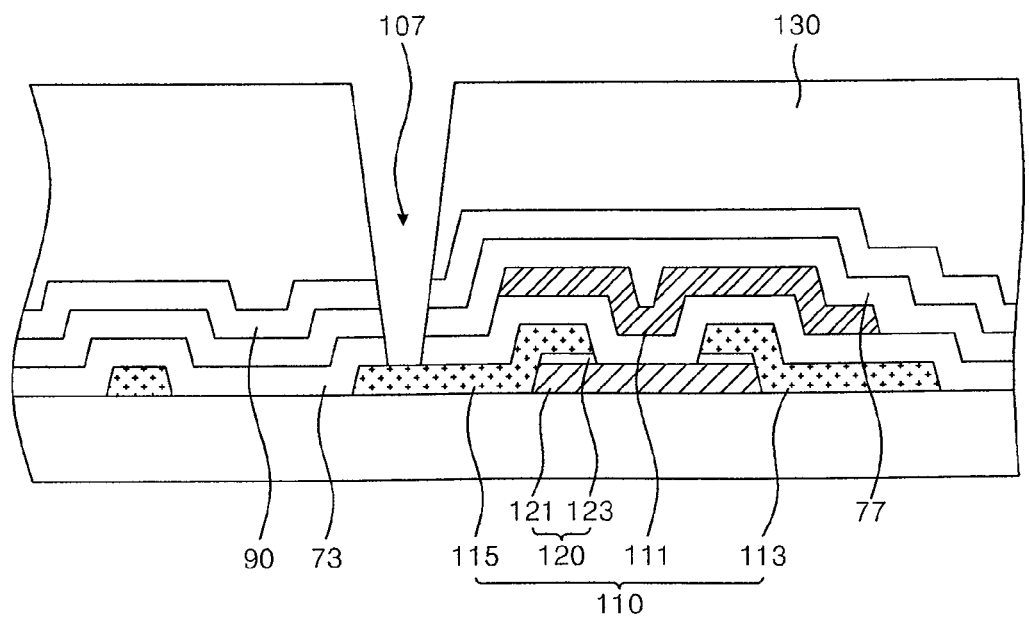

Referring to FIG. 3D, a protective layer 90 and a planarization layer 130 are formed on the second gate insulating layer 77. The protective layer 90 may be made of an inorganic insulating material such as a SiOx, or a SiNx. And then the planarization layer 130 having a contact hole 107 is formed.

The planarization layer 130 is formed on the protective layer 90 by a spin coating or a spinless coating technique. The contact hole 107 is formed by patterning the first and second gate insulating layers 73 and 77, the protective layer 90, and the planarization layer 130 by a photolithographic process and an etching process. The contact hole 107 penetrates the first and second gate insulating layers 73 and 77, the protective layer 90, and the planarization layer 130 to expose a portion of the drain electrode 115 of a driving TFT 110.

Figure 3E:
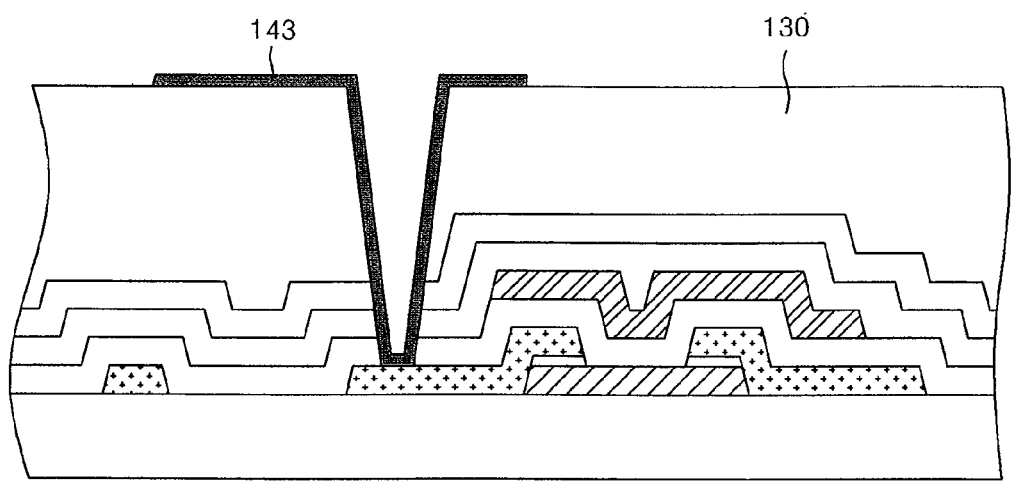

Referring to FIG. 3E, a pixel electrode 143 is formed on the planarization layer 130.

For example, a reflective electrode layer including a reflective material is deposited on the entire surface of the planarization layer 130 by a deposition method such as sputtering. The pixel electrode 143 is formed by patterning the reflective electrode layer by a photolithography process and an etching process. The reflective material may be, for example, Al, Mg, Ag, or Ca. A transparent electrode such as ITO or IZO may be formed on the reflective electrode layer.

Figure 3F:
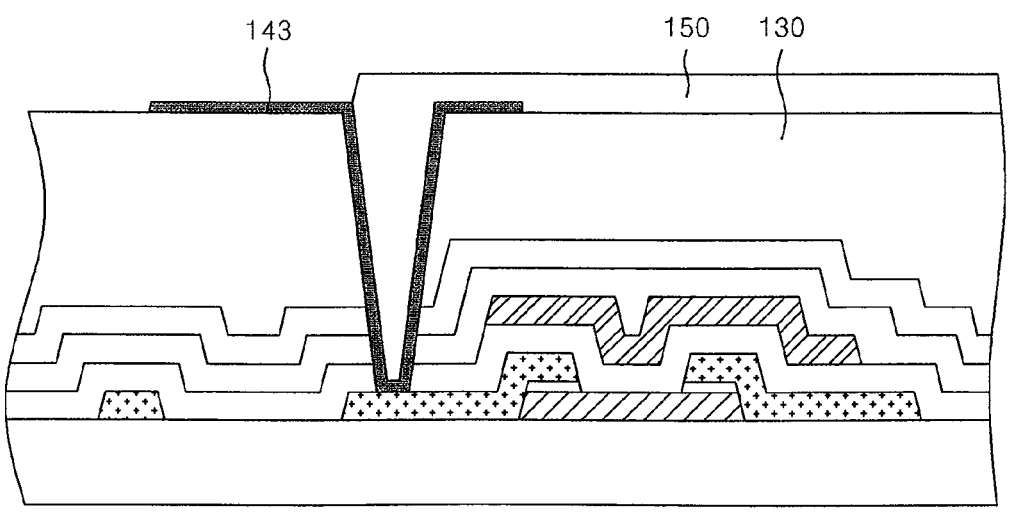

Referring to FIG. 3F, a wall 150 is formed on the pixel electrode 143 and the planarization layer 130.

The wall 150 is formed by depositing an organic insulating material on the planarization layer 130 on which the pixel electrode is formed and patterning the organic insulating material by a photolithographic process and an etching process.

Figure 3G:
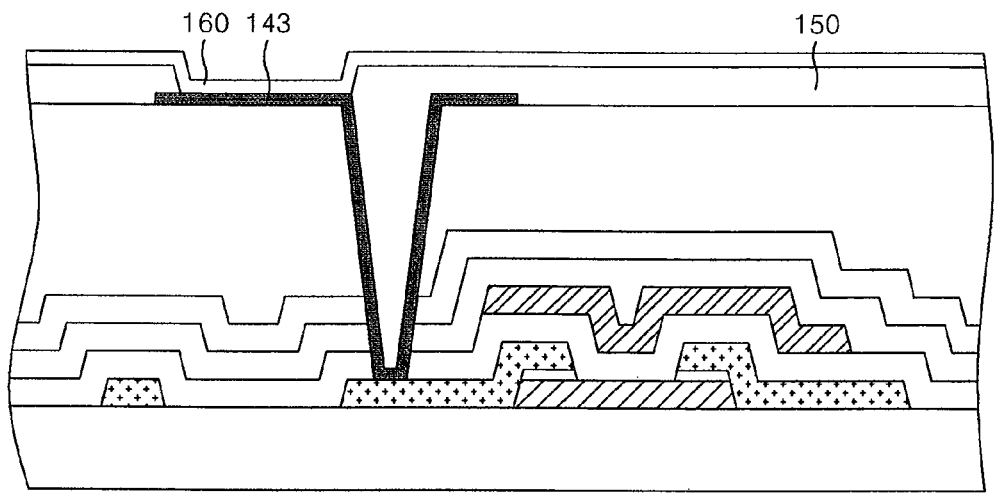

Referring to FIG. 3G, an organic layer 160 is formed on the pixel electrode 143.

The organic layer 160 includes a hole injection layer (not shown), a hole transport layer (not shown), an organic light-emitting layer (not shown), an electron transport layer (not shown), and an electron injection layer (not shown) that are sequentially stacked on t he pixel electrode 143. The hole injection layer, the hole transport layer, the electron transport layer, and the electron injection layer are formed on the entire surface of the organic light-emitting panel by using an open mask. The organic light-emitting layer, however, is formed by using masks for forming R, G and B sub-pixels.

Conventionally, an auxiliary electrode layer is formed before forming the organic layer 160, each layer of the organic layer 160 is formed by several masking and patterning processes so as not to cover the auxiliary electrode layer with an organic material. However, since an auxiliary electrode layer according to an exemplary embodiment of the present invention is formed after forming the organic layer 160, a separate mask for protecting the auxiliary electrode layer is provided when forming the organic layer 160, thereby simplifying patterning processes.

Figure 3H:
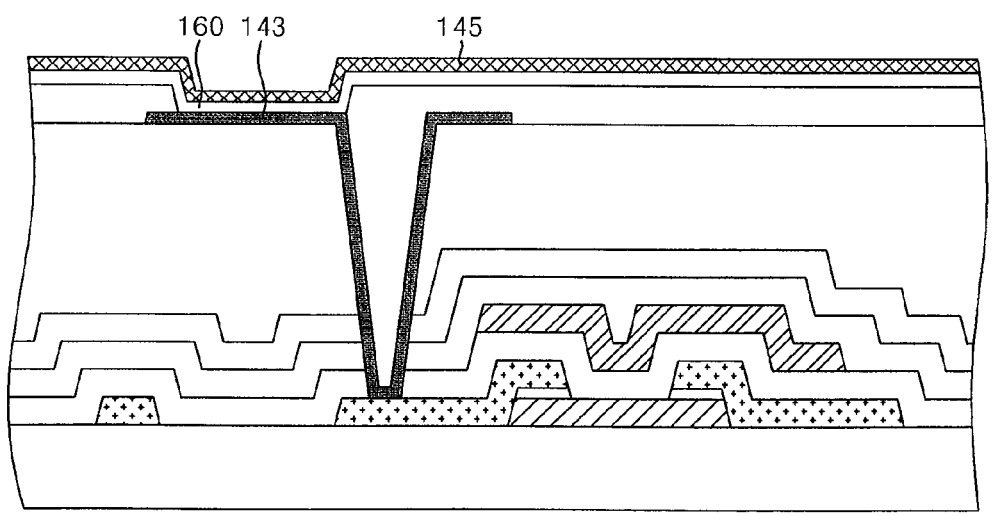

Referring to FIG. 3H, a common electrode 145 is formed on the organic layer 160.

More specifically, a metal or an alloy thereof is thinly deposited and is subject to a photolithographic process and an etching process, thereby forming the common electrode 145. The common electrode may be made of a transparent material such as ITO or IZO.

Figure 3I:
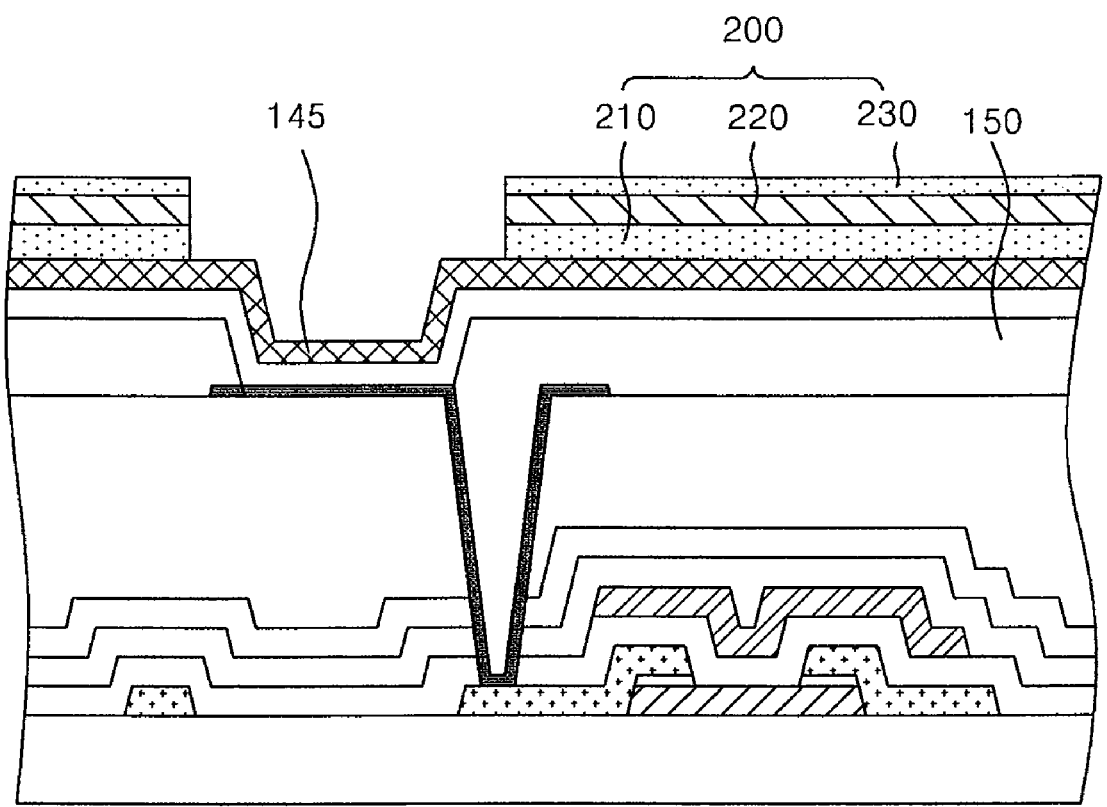

Referring to FIG. 3I, auxiliary electrode layer 200 is formed on the common electrode 145 to overlap the wall 150.

The auxiliary electrode layer 200 may be formed of a first metallic layer 210 and a metallic oxide layer 220, or formed of the first metallic layer 210, the metallic oxide layer 220, and a second metallic layer 230. The auxiliary electrode layer 200 may be formed by sequentially patterning the first metallic layer 210, the metallic oxide layer 220, and the second metallic layer 230 using a mask. The first metallic layer 210, the metallic oxide layer 220, and the second metallic layer 230 may be formed with a thickness of about 2000 Å, 1000 Å, and 50 Å, respectively. The first metallic layer 210 is formed of the same material as the metallic oxide layer 220 as described above. By forming the auxiliary electrode layer 200 including the first metallic layer 210, a resistance of the common electrode 145 may be minimized even though the common electrode 145 of a top emission structure has a high resistance value. A stacked structure where the first metallic layer 210 and the metallic oxide layer 220 are formed lowers reflectivity by controlling an optical thickness using the difference in a refractive index between the first metallic layer 210 and the metallic oxide layer 220. Therefore, the auxiliary electrode 200 serves as a black matrix having a light blocking function. A stacked structure where the first metallic layer 210, the metallic oxide layer 220, and the second metallic layer 230 are formed lowers the reflectivity more than a structure where the first metallic layer 210 and the metallic oxide layer 220 are formed, because of the difference in a refractive index between the first metallic layer 210, the metallic oxide layer 220, and the second metallic layer 230. This improves the improving a light blocking function as the black matrix.

Figure 3J:
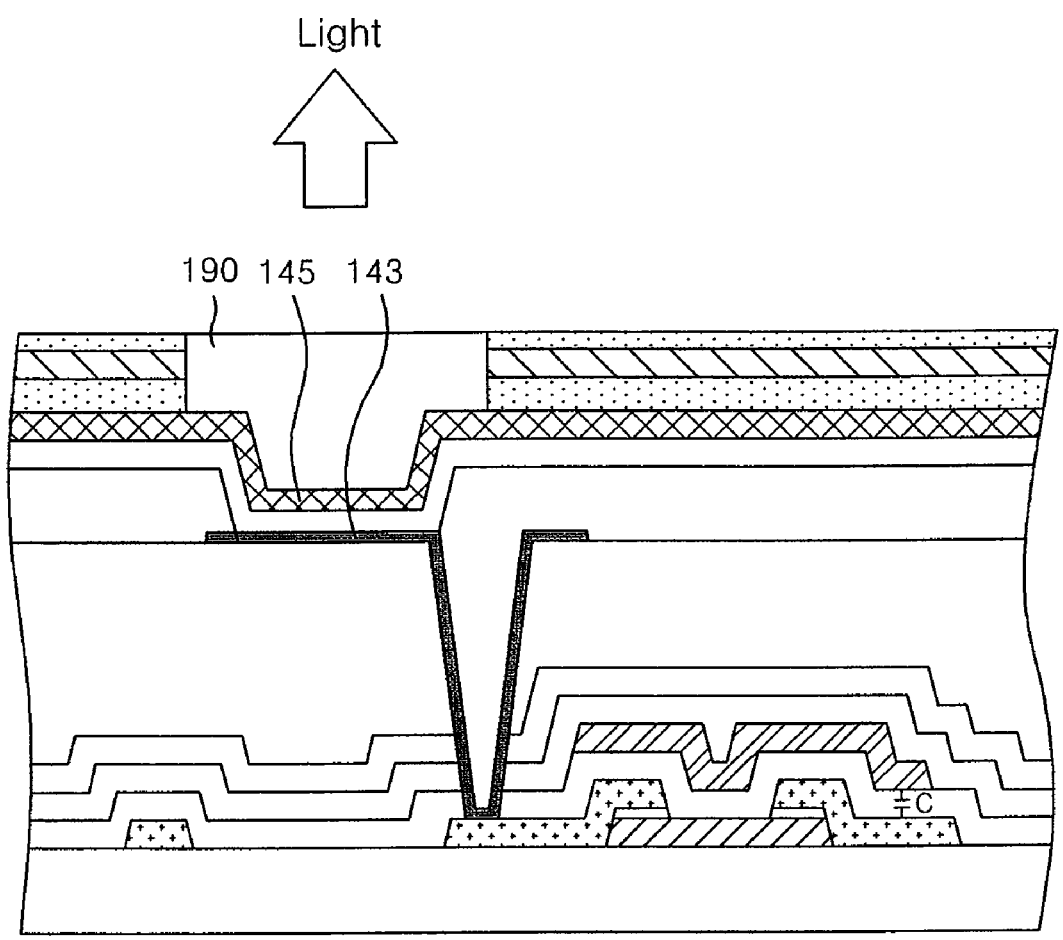

Referring to FIG. 3J, a color filter 190 is formed on the common electrode 145 to overlap the pixel electrode 143.

The color filter 190 includes R, G, and B color filters and is formed by a thermal evaporation method using a mask. Since the color filter 190 is formed by a deposition method of a dry process, the color filter 190 does not affect the organic layer 160 even though the color filter 190 is formed on the organic layer 160. The color filter 190 improves a contrast ratio of the OLED device with respect to external light. Accordingly, the OLED device does not separately require a polarizer film for improving the contrast ratio.

While the subject matter disclosed herein has been shown and described with reference to some exemplary embodiments, it should be understood by those of ordinary skill in the art that various changes in form and details may be made therein without departing from the spirit and the scope of the disclosure as defined in the appending claims.

What is claimed is:

1. An organic light-emitting display device, comprising:
   a substrate;
   a thin film transistor formed on the substrate;
   a planarization layer on the thin film transistor;
   a pixel electrode connected to the thin film transistor;
   a wall on the pixel electrode and the planarization layer, the wall including an aperture exposing a portion of the pixel electrode;
   an organic layer on the pixel electrode;
   a common electrode on the organic layer; and
   an auxiliary electrode layer positioned on the common electrode, the auxiliary electrode layer positioned overlapping the wall,
   wherein the auxiliary electrode includes a first auxiliary electrode layer extended in a first direction and a second auxiliary electrode layer extended in a second direction perpendicular to the first direction in a plan view, and
   wherein the auxiliary electrode layer comprises a first metallic layer, a metallic oxide layer formed on the first metallic layer, and a second metallic layer formed on the metallic oxide layer.

2. The organic light-emitting display device of claim 1, wherein the organic layer comprises:
   a hole injection layer formed on the pixel electrode;
   a hole transport layer formed on the hole injection layer;
   an organic light-emitting layer formed on the hole transport layer overlapping the pixel electrode;
   an electron transport layer formed on the organic light-emitting layer; and
   an electron injection layer formed on the electron transport layer.

3. The organic light-emitting display device of claim 1, wherein the first metallic layer comprises at least one selected from the group consisting of aluminum (Al), silver (Ag), cupper (Cu), gold (Au), iron (Fe), indium (In), neodymium (Nd), nickel (Ni), and palladium (Pd) or an alloy thereof.

4. The organic light-emitting display device of claim 1, wherein the metallic oxide layer comprises at least one selected from the group consisting of silicon oxide (SiO, SiO2), barium oxide (BaO), aluminum oxide (Al2O3), germanium oxide (GeO2), magnesium oxide (MgO), neodymium oxide (Nd2O3), tin oxide (SnO2), titanium oxide (TiO2), and tungsten oxide (WO3).

5. The organic light-emitting display device of claim 1, wherein the second metallic layer comprises at least one selected from the group consisting of aluminum (Al), silver (Ag), cupper (Cu), gold (Au), iron (Fe), indium (In), neodymium (Nd), nickel (Ni), and palladium (Pd) or an alloy thereof.

6. The organic light-emitting display device of claim 1, wherein the pixel electrode comprises a reflective conductive material.

7. The organic light-emitting display device of claim 6, wherein the reflective conductive material comprises at least one selected from the group consisting of aluminum (Al), magnesium (Mg), silver (Ag), mercury (Hg), and calcium (Ca).

8. The organic light-emitting display device of claim 1, wherein the common electrode comprises a transparent conductive material.

9. The organic light-emitting display device of claim 8, wherein the transparent conductive material comprises at least one selected from the group consisting of indium tin oxide (ITO), tin oxide (TO), indium zinc oxide (IZO), and indium tin zinc oxide (ITZO).

10. The organic light-emitting display device of claim 1, further comprising a color filter positioned on the common electrode and overlapping the pixel electrode.

11. The organic light-emitting display device of claim 1, further comprising a protective layer interposed between the planarization layer and the thin film transistor.

* * * * *